June 26, 1962 E. BELMONT ET AL 3,041,509

SEMICONDUCTOR DEVICE

Filed Aug. 11, 1958

INVENTORS.
EMANUEL BELMONT
CHARLES Z. LEINKRAM
BY [signature]
ATTORNEY 3,041,509
Patented June 26, 1962

1

2

3,041,509

SEMICONDUCTOR DEVICE

Emanuel Belmont, Asbury Park, N.J., and Charles Z. Leinkram, Port Chester, N.Y., assignors to The Bendix Corporation, a corporation of Delaware Filed Aug. 11, 1958, Ser. No. 754,249
1 Claim. (Cl. 317—235)

The present invention relates to semiconductor devices and more particularly to diffused base power transistors and the method of making the same.

Some of the factors that have affected the performance of semiconductors have been the low frequency response and thermal stability. It has been difficult to obtain desired characteristics in one parameter without detracting from others.

The present invention provides a transistor with good frequency response and thermal stability with improvements in the overall performance. The semiconductor material is prepared, utilizing the method disclosed in co-pending application Serial No. 750,893, filed July 25, 1958.

It is an object of the invention to provide an improved transistor.

Another object of the invention is to provide an improved transistor with a high frequency response.

Another object of the invention is to provide a transistor with improved thermal stability.

Another object of the invention is to provide a transistor having a high transconductance.

Another object of the invention is to provide a transistor capable of handling high currents at fast switching times.

Another object is to provide a transistor with a low base lead resistance.

Another object of the invention is to provide a transistor having improved breakdown voltage while maintaining a low input resistance.

A further object of the invention is to provide an improved transistor having a low saturation resistance.

The above and other objects and features of the invention will appear more fully hereinafter from a consideration of the following description taken in connection with the accompanying drawing wherein one embodiment of the invention is illustrated by way of example.

Figure 1:
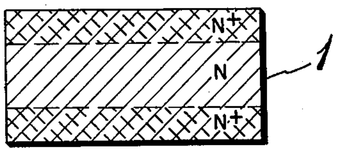
FIGURE 1 is a diagrammatic cross section of a semiconductor wafer before fabricating into a transistor.
Figure 2:
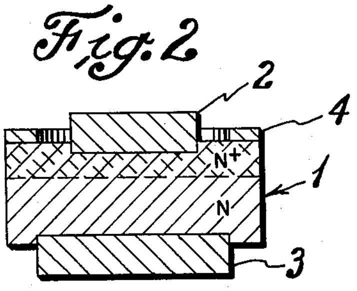
FIGURE 2 is a diagrammatic cross section of a transistor illustrating one embodiment of the invention.

Referring now to the drawing, a semiconductor wafer is indicated by the numeral 1 and is processed by the diffusion technique as set forth in the aforenoted co-pending application. Using the antimony oxide-acetic acid technique, an N type germanium wafer is processed to diffuse antimony into both sides of the wafer for a predetermined penetration. As an example, the penetration in both sides was to a depth of 3.5 mils and produced an $N^+NN^+$ wafer as illustrated in FIGURE 1.

One side of the wafer 1 is lapped for identification. The other side is lapped to remove the other $N^+$ layer. The wafer is then dried and etched to a specified thickness. Next, an emitter 2, collector 3 and base ring 4 are alloyed to the wafer 1. The device may then be mounted and packaged in any suitable manner.

Thus, is can be seen that a transistor fabricated according to the above will have a diffused section having a low resistance adjacent to the emitter and a section having a high resistance adjacent to the collector. The features of such a transistor are low $R_{in}$, high $V_{ce}$, high $f_{\alpha}$, high $f_{oc}$, high injection efficiency for improved forward current transfer ration at high currents, reduced transit time across the base region and high resistivity collector for improved collector voltage breakdown.

Although only one example of the invention has been described, various changes in the form and relative arrangement of the parts, which will now appear to those skilled in the art, may be made without departing from the scope of the invention.

What is claimed is:

A semiconductor device comprising an N type germanium wafer of a thickness greater than 3.5 mils and having antimony diffused into one side thereof to a depth of 3.5 mils, an emitter alloyed to said diffused side, a collector alloyed to the other side of said wafer and a base ring connected to said diffused side.

References Cited in the file of this patent

UNITED STATES PATENTS

| | | |
|---|---|---|
| 2,810,870 | Hunter et al. | Oct. 22, 1957 |
| 2,811,653 | Moore | Oct. 29, 1957 |
| 2,817,613 | Mueller | Dec. 24, 1957 |
| 2,829,422 | Fuller | Apr. 8, 1958 |
| 2,842,831 | Pfann | July 15, 1958 |
| 2,857,527 | Pankove | Oct. 21, 1958 |
| 2,903,628 | Giacoletto | Sept. 8, 1959 |